(12) United States Patent
Öz et al.

(10) Patent No.: US 10,641,854 B2
(45) Date of Patent: May 5, 2020

(54) SYSTEMS AND METHODS FOR AUTOMATIC VOXEL POSITIONING IN MAGNETIC RESONANCE SPECTROSCOPY

(71) Applicant: REGENTS OF THE UNIVERSITY OF MINNESOTA, Minneapolis, MN (US)

(72) Inventors: Gülin Öz, Minneapolis, MN (US); Christophe Lenglet, Shoreview, MN (US); Young Woo Park, Seoul (KR)

(73) Assignee: Regents of the University of Minnesota, Minneapolis, MN (US)

( * ) Notice: Subject to any disclaimer, the term of this patent is extended or adjusted under 35 U.S.C. 154(b) by 209 days.

(21) Appl. No.: 15/829,625

(22) Filed: Dec. 1, 2017

(65) Prior Publication Data
US 2018/0156883 A1 Jun. 7, 2018

Related U.S. Application Data

(60) Provisional application No. 62/428,846, filed on Dec. 1, 2016.

(51) Int. Cl.
| | |
|---|---|
| *G06K 9/00* | (2006.01) |
| *G01R 33/483* | (2006.01) |
| *G06T 7/11* | (2017.01) |
| *G01R 33/56* | (2006.01) |
| *G01R 33/46* | (2006.01) |

(52) U.S. Cl.
CPC ..... *G01R 33/4833* (2013.01); *G01R 33/5608* (2013.01); *G06T 7/11* (2017.01); *G01R 33/4625* (2013.01); *G06T 2207/10088* (2013.01); *G06T 2207/30016* (2013.01)

(58) Field of Classification Search
CPC ............ G01R 33/4833; G01R 33/5608; G01R 33/4625; G06T 7/11; G06T 2207/10088; G06T 2207/30016
USPC ......................................................... 382/131
See application file for complete search history.

(56) References Cited

U.S. PATENT DOCUMENTS

| | | | | |
|---|---|---|---|---|
| 7,319,784 B2 * | 1/2008 | Ryner | ..................... | G06T 19/00 324/307 |
| 2008/0103383 A1 * | 5/2008 | van der Kouwe | ..... | A61B 5/055 600/410 |

(Continued)

OTHER PUBLICATIONS

Andersson JLR, et al. Non-linear registration, aka spatial normalisation. FMRIB technical report 2007.

(Continued)

*Primary Examiner* — Van D Huynh
(74) *Attorney, Agent, or Firm* — Quarles & Brady LLP

(57) ABSTRACT

Systems and methods for automated voxel positioning in magnetic resonance spectroscopy ("MRS") are provided. In some aspects, a method includes receiving magnetic resonance ("MR") imaging data acquired from a subject using an MR imaging system and registering the MR imaging data to an atlas having a pre-defined volume of interest ("VOI"), or segmenting a region of interest ("ROI") directly from the MR data. The method also includes generating registration parameters based on the registration, and computing a transformed VOI using the pre-defined VOI in the atlas and the registration parameters. Alternatively, the VOI may be obtained by directly estimating it from the ROI.

20 Claims, 4 Drawing Sheets

(56) References Cited

U.S. PATENT DOCUMENTS

| | | | | |
|---|---|---|---|---|
| 2014/0320129 | A1* | 10/2014 | Zagorchev | A61B 5/055 324/309 |
| 2016/0133026 | A1* | 5/2016 | Patel | G06T 7/62 382/154 |
| 2016/0196659 | A1* | 7/2016 | Vrcelj | G06K 9/34 382/154 |
| 2017/0350953 | A1* | 12/2017 | Huang | G01R 33/543 |

OTHER PUBLICATIONS

Avants BB, et al. Advanced normalization tools (ANTS). Insight j 2009;2:1-29.

Bian W, et al. Towards Robust Reproducibility Study for MRSI via Fully Automated Reproducible Imaging Positioning. Proc. 23rd Annu. Conf. ISMRM. 2015.

Dou W, et al. Automatic voxel positioning for MRS at 7 T. MAGMA 2015;28(3):259-270.

Eskildsen SF, et al. BEaST: brain extraction based on nonlocal segmentation technique. Neuroimage 2012;59(3):2362-2373.

Grabner G, et al. Symmetric Atlasing and Model Based Segmentation: An Application to the Hippocampus in Older Adults. Medical Image Computing and Computer-Assisted Intervention—MICCAI 2006: 9th International Conference, Copenhagen, Denmark, Oct. 1-6, 2006 Proceedings, Part II. Berlin, Heidelberg: Springer Berlin Heidelberg; 2006. p. 58-66.

Han Y, et al. Automatic registration of brain magnetic resonance images based on Talairach reference system. J Magn Reson Imaging 2004;20(4):572-580.

Hancu I, et al. Automatic repositioning of single voxels in longitudinal 1H MRS studies. NMR in Biomedicine. 2005;18:352-361.

Jenkinson M, et al. BET2: MR-based estimation of brain, skull and scalp surfaces. Proc. Org. for Human Brain Mapp. 11. 2005.

Jenkinson M, et al. A global optimisation method for robust affine registration of brain images. Med Image Anal 2001;5(2):143-156.

Klein S, et al. elastix: a toolbox for intensity based medical image registration. IEEE Transactions on Medical Imaging. 2010;29(1):196-205.

Mazziotta, J.C. (2001), 'Four-dimensional probabilistic atlas of the human brain'. Journal of American Medical Informatics Association, vol. 8, No. 5, pp. 401-430.

O'Rourke J. Finding Minimal Enclosing Boxes. Int J Comput Inf Sci 1985;14(3):183-199.

Park et al. (2016) "Automatic voxel positioning for high cross-subject reproducibility in single voxel MRS" Power pitch presentation—poster #19, SMRM Workshop on MR Spectroscopy, Aug. 14-17, 2016 in Lake Constance, Germany, 5 pages.

Park YW, et al. Fast automatic voxel positioning with non-rigid registrations for improved between-subject consistency in MRS. Proc. Intl. Soc. Mag. Reson. Med. 24. 2016; Singapore. p. 2343.

Popescu V, et al. Optimizing parameter choice for FSL-Brain Extraction Tool (BET) on 3D T1 images in multiple sclerosis. Neuroimage 2012;61(4):1484-1494.

Ratai EM, et al. Automatic Repositioning of MRSI Voxels in Longitudinal Studies: Impact on Reproducibility of Metabolic Concentration Measurements. J Magn Reson Imaging 2008;27(5):1188-1193.

Shattuck, D.W. (2001), 'Magnetic resonance image tissue classification using a partial volume model', Neuroimage, vol. 13, pp. 856-876.

Smith, S.M. (2002), 'Fast robust automated brain extraction', Human Brain Mapping, vol. 17, No. 3, pp. 143-155.

Vanderkouwe et al. (2007) "Automatic prospective spectroscopy VOI placement based on brain segmentation" 2007 ISMRM 1 page.

\* cited by examiner

SYSTEMS AND METHODS FOR AUTOMATIC VOXEL POSITIONING IN MAGNETIC RESONANCE SPECTROSCOPY

CROSS-REFERENCE TO RELATED APPLICATIONS

This application claims the benefit of U.S. Provisional Patent Application Ser. No. 62/428,846, filed on Dec. 1, 2016, and entitled "SYSTEMS AND METHODS FOR AUTOMATIC VOXEL POSITIONING IN MAGNETIC RESONANCE SPECTROSCOPY."

STATEMENT REGARDING FEDERALLY SPONSORED RESEARCH

This invention was made with government support under NS080816 awarded by the National Institutes of Health. The government has certain rights in the invention.

BACKGROUND

Any nucleus that possesses a magnetic moment attempts to align itself with the direction of the magnetic field in which it is located. In doing so, however, the nucleus precesses around this direction at a characteristic angular frequency (Larmor frequency), which is dependent on the strength of the magnetic field and on the properties of the specific nuclear species (the magnetogyric constant $\gamma$ of the nucleus). Nuclei which exhibit these phenomena are referred to herein as "spins."

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a transient electromagnetic pulse (excitation field $B_1$) which is in the x-y plane and which is near the Larmor frequency, the net aligned moment, $M_z$, may be rotated, or "tipped", into the x-y plane to produce a net transverse magnetic moment Mt, which is rotating, or spinning, in the x-y plane at the Larmor frequency. The practical value of this phenomenon resides on signals that are emitted by the excited spins after the pulsed excitation signal $B_1$ is terminated. Depending upon chemically and biologically determined variable parameters such as proton density, longitudinal relaxation time ("T1") describing the recovery of $M_z$ along the polarizing field, and transverse relaxation time ("T2") describing the decay of Mt in the x-y plane, this nuclear magnetic resonance ("NMR") phenomena is exploited to obtain image contrast and concentrations of chemical entities or metabolites using different measurement sequences and by changing imaging parameters.

When utilizing NMR to produce images and chemical spectra, a technique is employed to obtain NMR signals from specific locations in the subject. Typically, the region to be imaged (region of interest) is scanned using a sequence of NMR measurement cycles that vary according to the particular localization method being used. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified from the Larmor frequencies typical of the local field. The acquisition of the NMR signals is referred to as sampling k-space, and a scan is completed when sufficient NMR cycles are performed to fully or partially sample k-space. The resulting set of received NMR signals are digitized and processed to reconstruct the image using various reconstruction techniques.

To generate an MR anatomic image, gradient pulses are typically applied along the x, y and z-axis directions to localize the spins along the three spatial dimensions, and MR signals are acquired in the presence of one or more readout gradient pulses. An image depicting the spatial distribution of a particular nucleus in a region of interest of the object is then generated, using known post-processing techniques. Typically, the hydrogen nucleus (1H) is imaged, though other MR-detectable nuclei may also be used to generate images and chemical spectra.

Similar to structural MRI, magnetic resonance spectroscopy ("MRS") utilizes a magnetic field and radio frequency transmit pulses to observe signals from specific nuclei in specific molecules. Example MRS nuclei include hydrogen (1H) or protons, as well as carbon-13 (13C), fluorine-19 (19F), phosphorous-31 (31P) and others. However, in contrast to structural MRI imaging, MR signals in MRS are typically acquired in the absence of readout gradient pulses. In addition, acquired MR signals are used to generate spectra indicating the chemical species present in selected voxels or volumes of interest ("VOIs"). The spectra can include several spectral peaks whose amplitudes (area) are associated with the concentrations of the various chemical species. Specifically, the peak positions represent the different resonance frequencies, or chemical shift, experienced by the detected nuclei due to different chemical (molecular) environments. Typically, the spectra are displayed in units of parts per million ("ppm") separation from a standard peak, since resonant frequency differences are typically on the order of a few Hz and MR signals generally precess in the MHz frequency range. For example, the chemical shift between protons in fat and water has been measured to be approximately 3.5 ppm, or approximately 220 Hz at 1.5 Tesla.

Oftentimes MRS studies involve comparing spectra obtained from different subjects, or populations of subjects, or tracking spectra for a given subject as a function of time. In doing so, it is important to be consistent in the selection of voxels or VOIs in order to generate accurate results and draw meaningful conclusions. Presently, voxel selection in MRS is performed manually, which is prone to appreciable error due to inter- and intra-operator variability. In addition, anatomic differences between different subjects makes selecting voxels manually and in a consistent manner difficult.

Automated voxel or VOI selection offers the promise of improved consistency. Existing technologies, such as the AutoAlign tool on Siemens, align scout images of a subject to predefined landmarks using rigid registration algorithms to ensure that subsequent images are acquired in a common space. As such, more reliable VOI positioning can be achieved on follow-up scans of the same subject. However, this approach does not guarantee that any particular brain structure is consistently aligned across different subjects with anatomical variability. To ensure consistency between subjects and prescribe VOIs individualized to subjects, one automated method utilizes pre-segmented brain regions (defined on a template) and an algorithm that calculates the tightest fitting oriented bounding box. However, this approach requires several hours of off-line processing as well as structures that can be clearly segmented. As such, this technique would not be applicable to brain structures that may not have clearly discernible borders, such as white matter brain regions.

Therefore, given the above, there is a need for improved systems and methods for voxel or VOI selection in MRS.

SUMMARY OF THE DISCLOSURE

The present disclosure addressed the drawbacks of previous technologies by providing an automated approach for selecting voxels or volumes of interest ("VOI") used in magnetic resonance spectroscopy ("MRS"). In particular, the present approach allows for fast automatic positioning in single voxel MRS that improves consistency of tissue coverage between subjects, as well as in longitudinal studies of a single subject. As will be appreciated from the description below, the present approach allows for much faster computation time compared to prior segmentation-based techniques, and can be utilized on any brain region pre-defined on an atlas. As such, the provided systems and methods may be applicable to a variety of diagnostic and investigative applications, such as multi-site clinical trials, where MRS is utilized as an outcome measure.

In accordance with one aspect of the disclosure, a method for automated voxel positioning in magnetic resonance spectroscopy (MRS) is provided. The method includes receiving magnetic resonance (MR) imaging data acquired from a subject using magnetic resonance imaging (MRI) system. An initial volume-of-interest (VOI) is estimated from the MR imaging data, and a VOI is then computed from the initial VOI by computing spatial parameters of the computed VOI based on the initial VOI. The spatial parameters may be computed, for instance, based on a minimum bounding box. The initial VOI may be a pre-defined VOI contained in an atlas, which is transformed from a coordinate space associated with the atlas to a coordinate space associated with the subject, or may be a region-of-interest segmented from the MR imaging data. The MRI system is operated to acquire MRS data from the computed VOI using the spatial parameters of the computed VOI, and a report indicative of the computed VOI based at least in part on the acquired MRS data is generated.

In accordance with another aspect of the disclosure, a system for automated voxel positioning in magnetic resonance spectroscopy ("MRS") is provided. The system includes an input configured to receive magnetic resonance ("MR") imaging data acquired from a subject using an MR system, and a processor programmed to access the MR imaging data, and generate registration parameters by registering the MR imaging data to an atlas having a pre-defined volume of interest ("VOI"). The processor is also programmed to compute a transformed VOI using the pre-defined VOI in the atlas and the registration parameters, and generate a report indicative of the transformed VOI. The system further includes an output for displaying the report.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
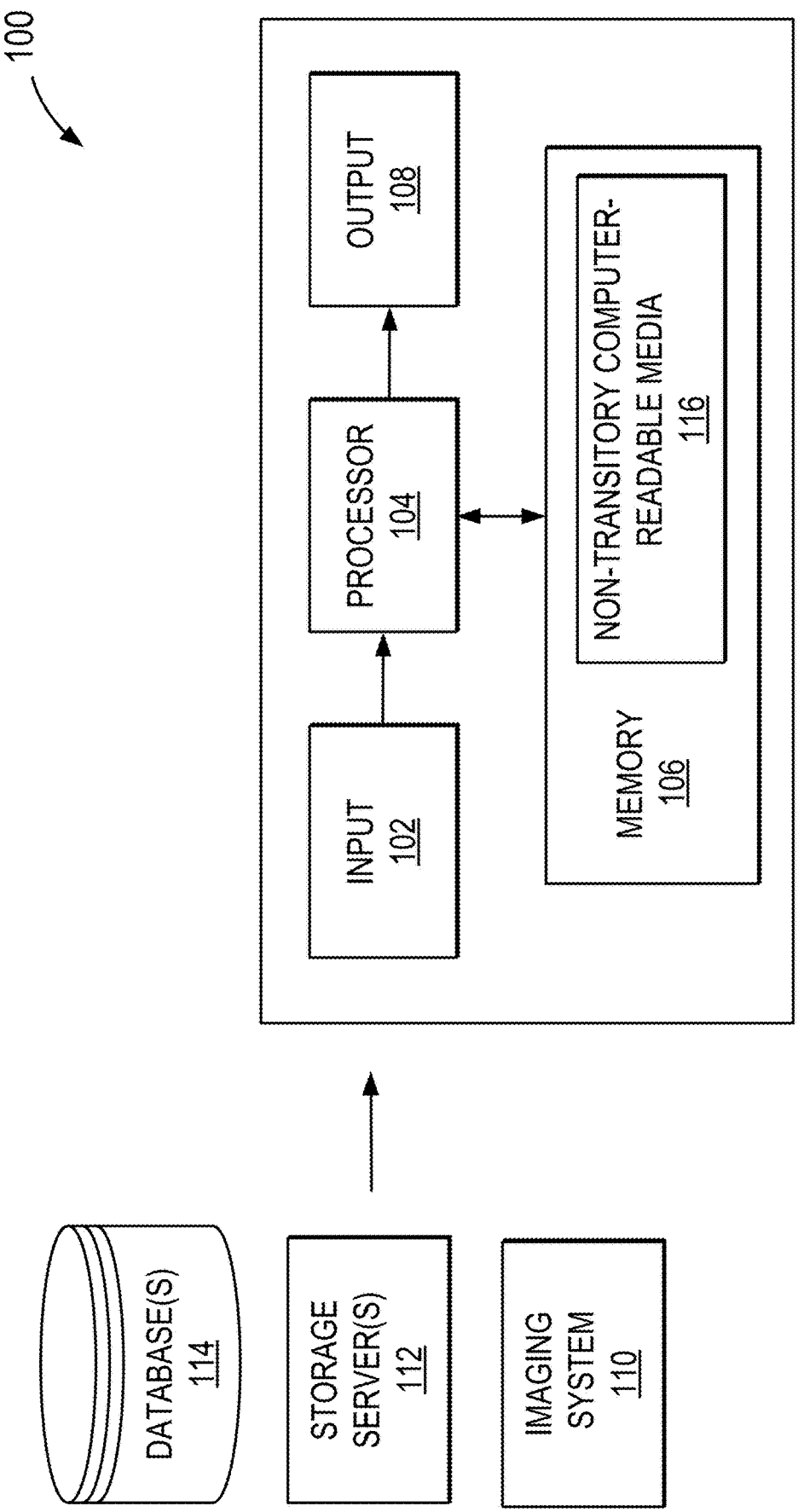
FIG. 1 is a schematic diagram of an example system, in accordance with aspects of the present disclosure.

Turning now to FIG. 1, a block diagram of an example computer system 100 that can implement the methods described in the present disclosure, is shown. In general, the computer system 100 may include an input 102, a processor 104, a memory 106, and an output 108, and may be configured to carry out steps, in accordance with methods described herein, including methods directed to automated voxel positioning for use in magnetic resonance spectroscopy ("MRS").

As shown in FIG. 1, the computer system 100 may communicate with one or more imaging system 110, storage servers 112, or databases 114, by way of a wired or wireless connection. In general, the computer system 100 may be any device, apparatus, or system configured for carrying out instructions for implementing the methods described in the present disclosure. The computer system 100 may also operate as part of, or in collaboration with, various computers, systems, devices, machines, mainframes, networks, or servers. In some aspects, the computer system 100 may be a portable or mobile device, such as a cellular phone or smartphone, laptop, tablet, and the like. In this regard, the computer system 100 may be a system that is designed to integrate a variety of software and hardware capabilities and functionalities, and may be capable of operating autonomously. In addition, although shown as separate from the imaging system 110, in some aspects, the computer system 100, or portions thereof, may be part of, or incorporated into, the imaging system 110, such as a magnetic resonance imaging ("MRI") system.

The input 102 may include different input elements, such as a mouse, keyboard, touchpad, touch screen, buttons, and the like, for receiving various selections and operational instructions from a user. The input 102 may also include various drives and receptacles, such as flash-drives, USB drives, CD/DVD drives, and other computer-readable medium receptacles, for receiving various data and information. To this end, input 102 may also include various communication ports and modules, such as Ethernet, Bluetooth, or WiFi, for exchanging data and information with these, and other external computers, systems, devices, machines, mainframes, servers or networks.

In addition to being configured to carry out various steps for operating the computer system 100, the processor 104 may also be programmed to automatically determine a voxel or volume-of-interest ("VOI") position for use in MRS. Specifically, the processor 104 may be configured to execute instructions, stored in a non-transitory computer readable-media 116, to access MR imaging data and based at least in part on that MR imaging data generate a VOI in the coordinate space associated with the imaged subject, as described in the present disclosure. Although the non-transitory computer readable-media 116 is shown in FIG. 1 as included in the memory 106, it may be appreciated that non-transitory instructions executable by the processor 104 may be stored in another data storage location having non-transitory computer readable-media.

Information associated with an atlas and a pre-defined VOI contained in that atlas may also be stored in the memory 106, the database(s) 114, storage server(s) 112, or other data storage location accessible by the processor 104. As an example, the pre-defined VOI may include white matter ("WM") tissue, a grey matter ("GM") tissue, cerebrospinal fluid ("CSF"), a posterior cingulate cortex tissue, and a hippocampus tissue. In some aspects, the processor 104 may also perform pre-processing on the MR imaging data, such as segmenting imaging data associated with brain tissue from imaging data of the subject's head. The processor 104 may also be programmed to generate one or more images using the imaging data.

When registering the MR imaging data to an atlas, the processor 104 may perform a linear registration, a non-linear registration, an affine registration, and a b-spline registration, or a combination thereof, in order to determine registration parameters for transforming the pre-defined VOIs from the coordinate space of the atlas to a patient-specific coordinate space. In some aspects, the MR imaging data of the subject is fixed while the atlas is moving. Alternatively, the MR imaging data of the subject may be moving while the atlas is fixed, and so an inverse transformation may be performed in the registration process. Because it is typically more advantageous to register low resolution data to high resolution, selection of which data is fixed may depend on the image resolution.

Using the registration parameters and pre-defined VOI, the processor 104 may then compute a transformed VOI. The transformed VOI may be rotationally, translationally, affine transformed, and b-spline transformed relative to the pre-defined VOI. In some aspects, the processor 104 may also be programmed to generate a minimum bounding box associated with the transformed VOI. To this end, the processor 104 may be configured to utilize a principal components analysis ("PCA") or other suitable algorithm to calculate the bounding box. Alternatively, other algorithms may be used to generate the minimum bounding box, such as a tightest fitting bounding box algorithm or a best fit oriented bounding box algorithm.

In some implementations, the VOI can be computed based on the MR imaging data. In these instances, the processor 104 may be configured to segment the MR imaging data to generate a region-of-interest ("ROI"), and to process the segmented ROI to generate the VOI. For instance, the VOI can be directly estimated from the segmented ROI.

In some aspects, the processor 104 may be configured to use information associated with the computed VOI to direct an MR system to acquire MRS data. Using the MRS data, the processor 104 may generate one or more spectra, such as 1H spectra. Such spectra may be compared to various references, such as spectra from a previous time frame or from a different subject. In some aspects, the processor 104 may be further programmed to determine a condition of the subject based on the comparison and/or based on analysis of generated spectra.

The processor 104 may also be configured to generate a report, in any form, and provide it via output 108. For example, the report may include various raw or processed images, as well as various VOIs overlaid thereon. The report may include information associated with the computed VOI, such as position, size, orientation, bounding box, and so forth, as well as spectra indicating chemical species therein. The report may further indicate a condition of the subject.

Figure 2:
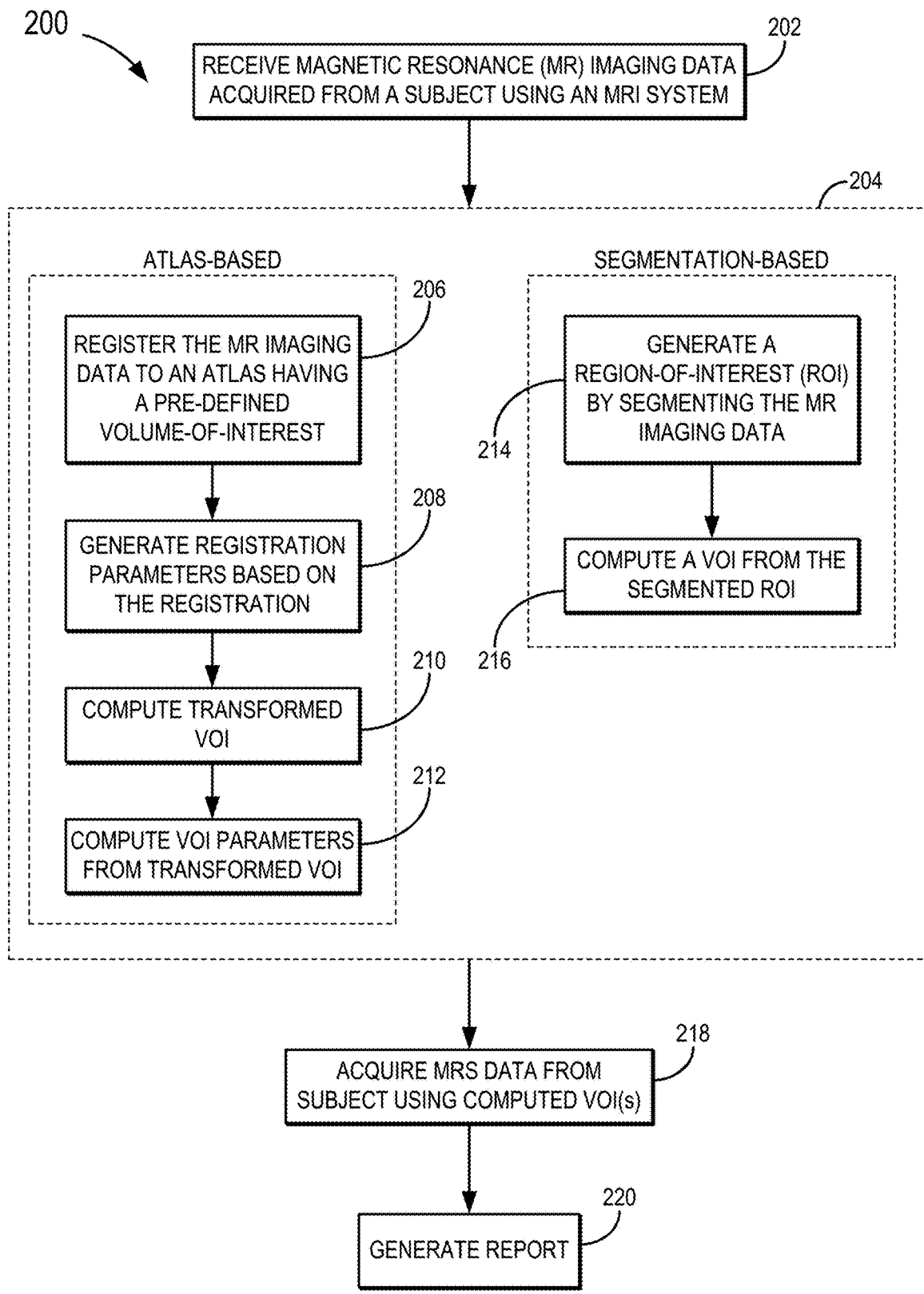
FIG. 2 is a flowchart setting forth steps of a process, in accordance with aspects of the present disclosure.

Turning to FIG. 2, a flowchart setting forth steps of an example process 200, in accordance with aspects of the present disclosure is shown. The process 200 may be carried out using any suitable system, device, or apparatus, such as the computer system 100 described with reference to FIG. 1. In some aspects, the process 200 may be embodied in a program or software in the form of instructions, executable by a computer or processor, and stored in non-transitory computer-readable media.

The process 200 may begin at process block 202 with receiving MR imaging data acquired from a subject using an MR system. In some aspects, the MR imaging data may be acquired at process block 202 using an MRI system, as will be described. Non-limiting example MR imaging data may include three-dimensional ("3D") anatomical or structural data such as T1-weighted MR data. As described, the MR imaging data, in the form of DICOM files for example, may also be accessed at process block 202 from a memory, database, storage server, PACS, or other data storage location. The MR imaging data may be converted and pre-processed at process block 202, for instance by carrying out a conversion from DICOM format to a NIFTI format, as well as performing a brain extraction algorithm on the converted data, using an FSL-BET tool, for example.

As generally indicated at process block 204, a VOI is then computed based at least in part on the MR imaging data. In one example processing pipeline, the VOI is generated using an atlas based method. In another example processing pipeline, the VOI is generated using a segmentation-based method. In both approaches, an initial VOI is estimated in the coordinate space of the subject being imaged, and then a final VOI is computed from the initial VOI.

In instances where the VOI is computed based on an atlas, the atlas can be retrieved from a memory or other data storage and the initial VOI can be selected from the retrieved atlas. The initial VOI may be, for instance, a set of voxels, coordinates that define a volume in the coordinate space of the atlas, combinations of both, or other volume elements or suitable data.

In instances where the VOI is computed based on the MR imaging data, the MR imaging data can be segmented to generate a region-of-interest ("ROI") as the initial VOI. The ROI may be, for instance, a set of voxels, coordinates that define a region in the coordinate space of the imaged subject, combinations of both, or other volume elements or suitable data.

In particular, in the atlas-based approach, the received MR imaging data may then be registered to an atlas, as indicated at process block 206. The atlas may include one or more pre-defined VOIs, including VOIs associated with specific brain tissues or structures. The atlas may be a standard imaging atlas (e.g., the MNI atlas) or a customized atlas generated based on images of a particular anatomy from different subjects. As described, the registration may include performing a linear registration, a non-linear registration, an affine registration, and a b-spline registration, or a combination thereof. The registration process generates registration parameters, as indicated at process block 208. Using the registration parameters, one or more transformed VOIs may be computed by applying the registration parameters to transform one or more pre-defined VOIs from the coordinate space of the atlas to a subject-specific coordinate space associated with the imaged subject, as indicated at process block 210.

The final VOI is then computed from the transformed VOI, as indicated at process block 212. For instance the final VOI coordinates, angulations, and size, can be computed from the transformed VOI based on a bounding box. To this end, one or more transformed VOI masks may be generated and a principal components analysis ("PCA") or other suitable algorithms may be applied to calculate the bounding box. For instance, a minimal oriented bounding box ("OBB") algorithm can be applied to the transformed VOI. To provide additional reduction in computation time, the number of voxels used for the OBB calculation can be reduced, such as by first computing a convex hull using a quickhull or other suitable algorithm.

In the segmentation-based approach, the received MR imaging data may be segmented to generate one or more ROIs, as indicated at process block 214. The ROIs may be associated with specific brain tissues or structures. As described, the segmentation may include performing any suitable image segmentations algorithm to achieve segmentation of the desired tissue, anatomical structure, or image region. A VOI is then computed based on the one or more segmented ROIs, as indicated at process block 216. For instance, the final VOI coordinates, angulations, and size, can be computed from the segmented ROI based on a bounding box, such as by using the minimum bounding box algorithms described above.

In some aspects, information associated with the computed VOI(s) may be used to acquire MRS data, as indicated at process block 218. For instance, the VOI position and dimension data are transferred to the MRI scanner and used to operate the MRI system to acquire MRS data from the computed VOI. Using the MRS data, one or more spectra may be generated. Such spectra may be compared to various references, such as spectra from a previous time frame or from a different subject. In addition, in some aspects, a condition of the subject may be determined based on the comparison and/or based on analysis of generated spectra.

A report, in any form, may then be generated at process block 220. The report may include various raw or processed images, as well as various VOIs overlaid thereon. The report may include information associated with the computed VOI(s), such as position, size, orientation, bounding box, and so forth, as well as spectra indicating chemical species therein. The report may further indicate a condition of the subject.

Figure 3:
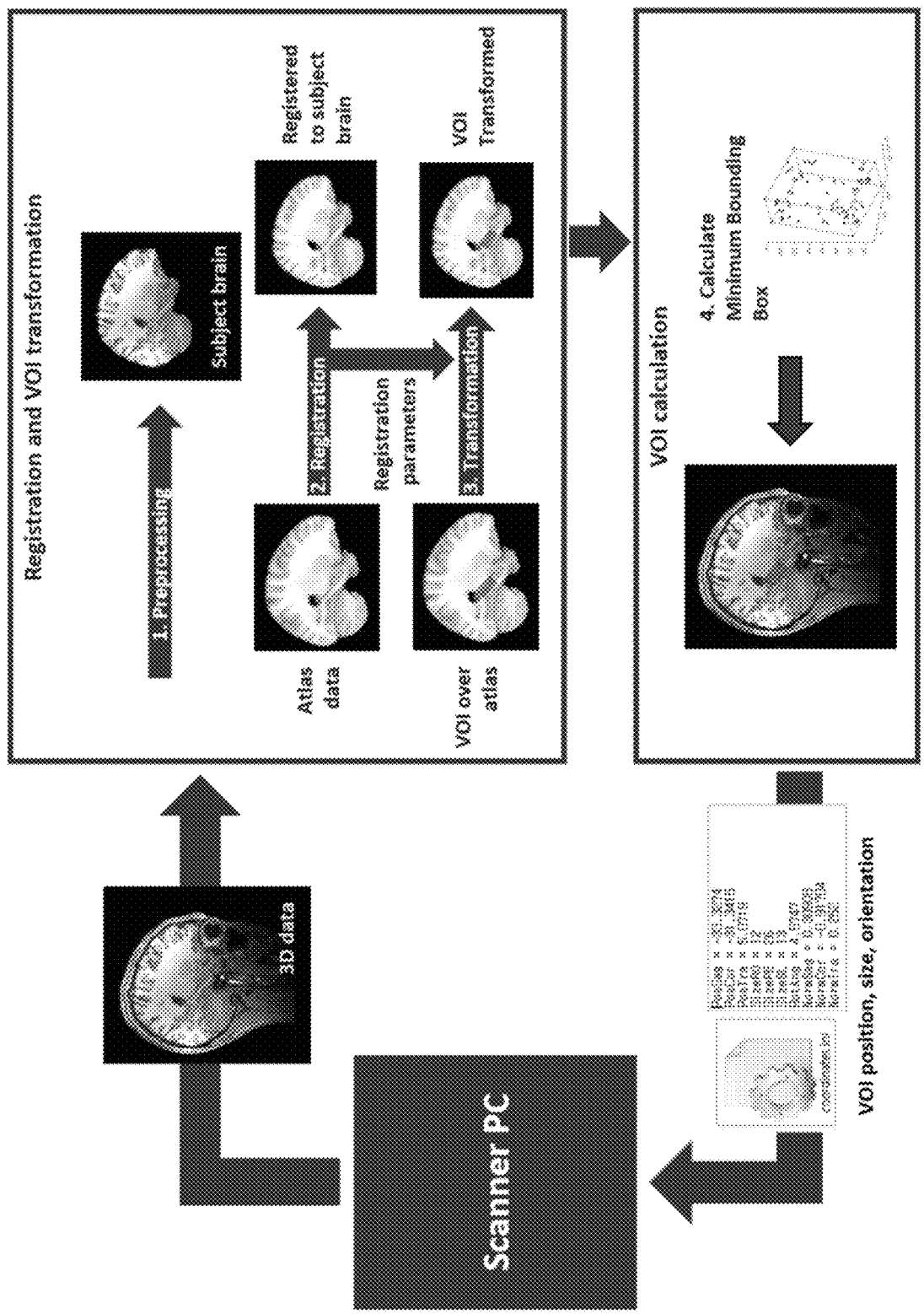
FIG. 3 is a graphical illustration of a process for automated voxel positioning, in accordance with aspects of the present disclosure.

By way of example, FIG. 3 illustrates a process for automated voxel positioning, in accordance with some aspects of the present disclosure. The process begins with 3D anatomical data acquired from a subject using a scanner, such as an MRI system. The 3D anatomical data is pre-processed in a first step to isolate the subject's brain. Then, a registration of atlas data to the imaging data associated with the subject's brain is performed, to yield a number of registration parameters, as described. Using a VOI associated with the atlas data, and registration parameters, a transformation is performed to generate a transformed VOI. As described an initial VOI can also be generated by segmenting the 3D anatomical data to compute one or more ROIs, which may be selected as the initial VOI. The initial VOI is then used in a minimum bounding box calculation. VOI information, including position, size, and orientation, is then provided to the scanner. At this point, an operator may decide to carry out MRS data acquisition based on the provided VOI, or alternatively proceed with a different or modified VOI selection.

Figure 4:
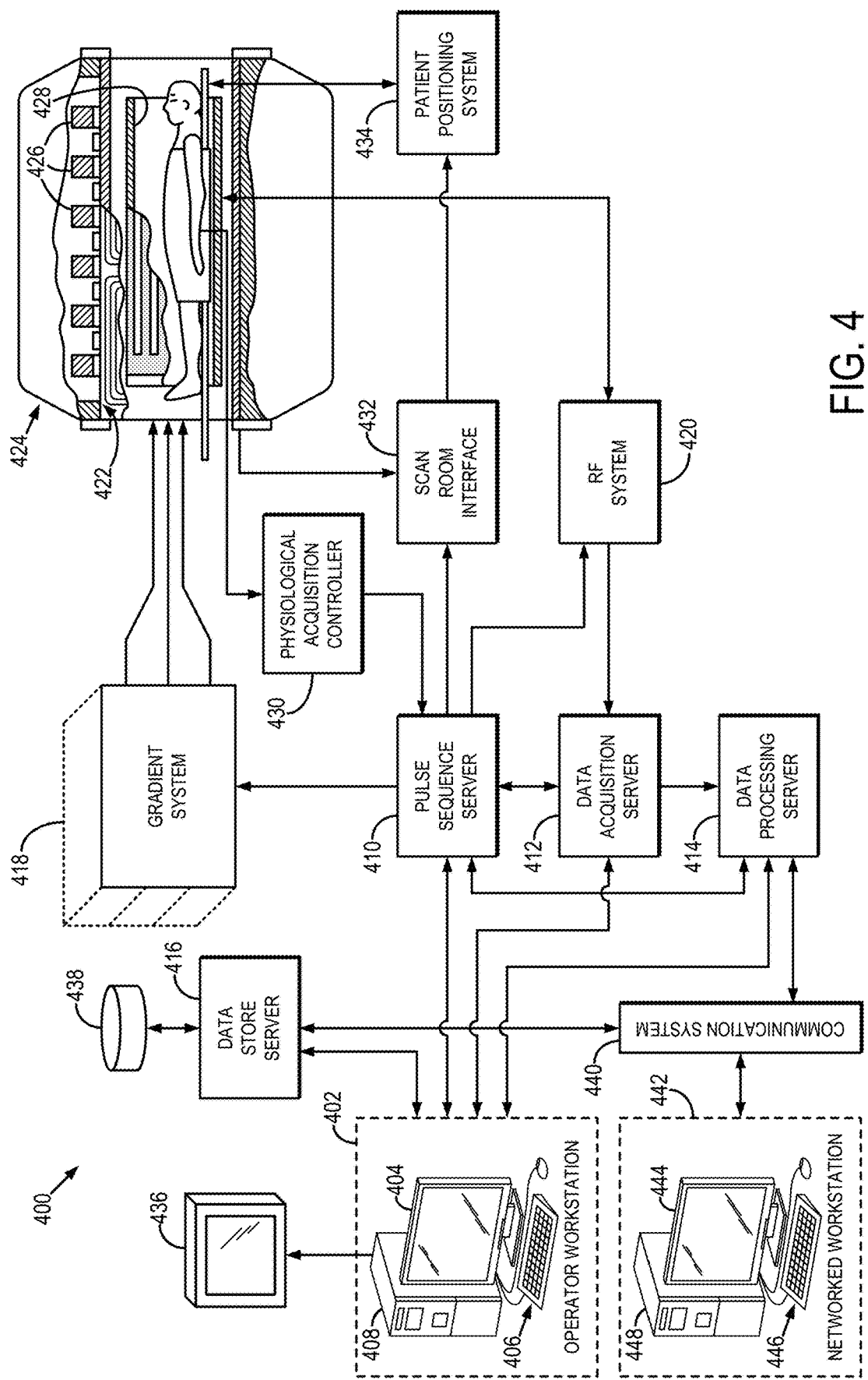
FIG. 4 is a block diagram of an example magnetic resonance imaging ("MRI") system, in accordance with aspects of the present disclosure.

Referring particularly now to FIG. 4, an example of an MRI system 400 that can implement the methods described here is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{1}$$

and the phase of the received magnetic resonance signal may also be determined according to the following relationship:

$$\varphi = \tan^{-1}\left(\frac{Q}{I}\right). \tag{2}$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MRI system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

The present disclosure has described one or more preferred embodiments, and it should be appreciated that many equivalents, alternatives, variations, and modifications, aside from those expressly stated, are possible and within the scope of the invention.

The invention claimed is:

1. A computer-implemented method for automated voxel positioning in magnetic resonance spectroscopy ("MRS"), the method comprising:
   a) receiving magnetic resonance ("MR") imaging data acquired from a subject using magnetic resonance imaging (MRI) system;
   b) estimating an initial volume-of-interest (VOI) from the MR imaging data;
   c) computing a VOI from the initial VOI by computing spatial parameters of the computed VOI based on the initial VOI;
   d) operating the MRI system to acquire MRS data from the computed VOI using the spatial parameters of the computed VOI; and
   e) generating a report indicative of the computed VOI based at least in part on the acquired MRS data.

2. The method of claim 1, wherein estimating the initial VOI from the MR imaging data comprises:
   providing an atlas having a pre-defined VOI contained therein;
   generating registration parameters by computing a registration between the MR imaging data and the atlas; and
   estimating the initial VOI by transforming the pre-defined VOI from a coordinate space associated with the atlas to a coordinate space associated with the subject by applying using the registration parameters.

3. The method of claim 2, wherein the pre-defined VOI is associated with at least one of a white matter ("WM") tissue, a grey matter ("GM") tissue, a cerebrospinal fluid ("CSF"), a posterior cingulate cortex tissue, or a hippocampus tissue.

4. The method of claim 2, wherein the registration parameters are generated by computing at least one of a linear registration, a non-linear registration, an affine registration, or a b-spline registration between the MR imaging data and the atlas.

5. The method of claim 2, wherein during the registration the atlas is allowed to move while the MR imaging data is fixed in space.

6. The method of claim 2, wherein during the registration the MR imaging data is allowed to move while the atlas is fixed in space.

7. The method of claim 1, wherein estimating the initial VOI from the MR imaging data comprises computing a region-of-interest (ROI) by segmenting the MR imaging data and selecting the ROI as the initial VOI.

8. The method of claim 1, wherein the spatial parameters of the VOI are computed by computing a minimum bounding box on the initial VOI.

9. The method of claim 8, wherein the minimum bounding box is computed using an oriented bounding box (OBB) algorithm.

10. The method of claim 8, wherein the spatial parameters include coordinates of the VOI in a coordinate space associated with the subject.

11. The method of claim 8, wherein the spatial parameters include an angulation of the VOI in a coordinate space associated with the subject.

12. The method of claim 8, wherein the spatial parameters include a size of the VOI.

13. The method of claim 1, wherein generating the report includes analyzing the MRS data to generate at least one spectrum.

14. The method of claim 13, wherein generating the report further comprises comparing the at least one spectrum with a reference spectrum to determine a condition of the subject.

15. A system for automated voxel positioning in magnetic resonance spectroscopy ("MRS"), the system comprising:
 an input configured to receive magnetic resonance ("MR") imaging data acquired from a subject using an MR system;
 a processor programmed to:
  access the MR imaging data;
  generate registration parameters by registering the MR imaging data to an atlas having a pre-defined volume of interest ("VOI");
  compute a transformed VOI using the pre-defined VOI in the atlas and the registration parameters;
  generate a report indicative of the transformed VOI; and
 an output for displaying the report.

16. The system of claim 15, wherein the pre-defined VOI comprises at least one of a white matter ("WM") tissue, a grey matter ("GM") tissue, a cerebrospinal fluid ("CSF"), a posterior cingulate cortex tissue, and a hippocampus tissue.

17. The system of claim 15, wherein the processor is further programmed to apply at least one of a linear registration, a non-linear registration, an affine registration, and a b-spline registration.

18. The system of claim 15, wherein the processor is further programmed to generate a minimum bounding box associated with the transformed VOI.

19. The system of claim 15, wherein the processor is further programmed to direct the MR system to acquire MRS data based on the transformed VOI.

20. The system of claim 19, wherein the processor is further programmed to analyze the MRS data to generate at least one spectrum.

* * * * *